United States Patent
Ellens et al.

(10) Patent No.: US 6,552,487 B1
(45) Date of Patent: Apr. 22, 2003

(54) PHOSPHOR FOR LIGHT SOURCES, AND ASSOCIATED LIGHT SOURCE

(75) Inventors: Andries Ellens, Munich (DE); Franz Zwaschka, Ismaning (DE)

(73) Assignee: Patent-Treuhand-Gesellschaft fuer elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/694,635

(22) Filed: Oct. 23, 2000

Related U.S. Application Data

(63) Continuation-in-part of application No. 09/675,770, filed on Sep. 29, 2000, now abandoned.

(30) Foreign Application Priority Data

Oct. 27, 1999 (DE) .......................................... 199 51 790

(51) Int. Cl.$^7$ .......................... H01J 29/20; C09K 11/00
(52) U.S. Cl. ...................... 313/503; 313/468; 313/486; 252/301.4 R
(58) Field of Search ................................. 313/502, 503, 313/504, 468, 486, 487; 252/301.4 R; 257/11, 78, 102, 103

(56) References Cited

U.S. PATENT DOCUMENTS 4,550,256 A 10/1985 Berkstresser et al. .... 250/483.1
6,351,069 B1 * 2/2002 Lowery et al. ............. 313/512

FOREIGN PATENT DOCUMENTS

GB          2000173      1/1979    ........... C09K/11/00
WO      WO 00/36051      6/2000    ........... C09K/11/80

* cited by examiner

*Primary Examiner*—Ashok Patel
(74) *Attorney, Agent, or Firm*—Robert F. Clark

(57) ABSTRACT

The phosphor according to the invention has the following composition:

$$(RE_{1-x-y}Pr_xCe_y)_3(Al,Ga)_5O_{12},$$

where

RE=Y, Sc, Tb, Gd, La and/or Lu;
$0.00001 < x < 0.05$;
$0.01 < y < 0.2$.

29 Claims, 5 Drawing Sheets

PHOSPHOR FOR LIGHT SOURCES, AND ASSOCIATED LIGHT SOURCE

CROSS REFERENCES TO RELATED APPLICATIONS

This application is continuation-in-part of application Ser. No. 09/675,770 filed Sep. 29, 2000 now abandoned.

TECHNICAL FIELD

The invention is based on a phosphor for light sources and an associated light source in accordance with the preamble of claim 1. It relates in particular to a garnet phosphor which emits in the long-wave range of the visible spectral region and is to be excited by short wavelengths in the visible spectral region. Suitable light sources are in particular a lamp (primarily a fluorescent lamp) or an LED (light-emitting diode), which overall generates white light, for example.

PRIOR ART

WO 98/05078 has already disclosed a phosphor for light sources and an associated light source. In that document, the phosphor used is a garnet of the structure $A_3B_5O_{12}$, the host lattice of which, as first component A, comprises at least one of the rare earths Y, Lu, Sc, La, Gd or Sm. Furthermore, one of the elements Al, Ga or In is used for the second component B. The only activator used is Ce.

A very similar phosphor is known from WO 97/50132. The activator used in that document is either Ce or Tb. While Ce emits in the yellow spectral region, the emission from Tb is in the green spectral region. In both cases, the complimentary color principle (blue-emitting light source and yellow-emitting phosphor) is used to achieve a white luminous color with a semiconductor element.

Finally, EP-A 124 175 describes a fluorescent lamp which, in addition to a mercury fill, contains a plurality of phosphors. These are excited by UV radiation (254 nm) or also by short-wave radiation at 460 nm. Three phosphors are selected in such a way that they add up to form white (color mixture).

SUMMARY OF THE INVENTION

The object of the invention is to provide a phosphor in accordance with the preamble of claim 1 which is able to withstand high thermal loads and is eminently suitable for excitation in the short-wave visible spectral region.

This object is achieved through the characterizing features of claim 1. Particularly advantageous configurations are given in the dependent claims.

In detail, according to the invention, a phosphor is proposed for excitation by a radiation source whose emission is in the short-wave optical spectral region. The phosphor has a garnet structure $A_3B_5O_{12}$, and it is doped and activated with Ce, the second component B representing at least one of the elements Al and Ga. The first component A contains a rare earth RE selected from the group Y, Sc, Gd, Tb, La and/or Lu, with an amount of at most 5 mol % of A being replaced by praseodymium (Pr). Because of the concentration quenching to be observed with Pr, above all an amount of at most 5 mol % is to be recommended. Particularly favorable is an amount of at most 1 mol %. In this case praseodymium acts as second activator in addition to Ce according to the formula $A_3B_5O_{12}$: (Ce, Pr).

Advantageously, the first component A is predominantly (more than 75 mol %) formed by yttrium and/or lutetium, in order to achieve a high efficiency. In addition thereto, it is possible to use amounts of Tb, Sc, Gd and/or La for fine-tuning. Particularly advantageous is the addition of Tb to the component A in small quantities (0.1 to 20 mol %), since Tb improves the temperature quenching. Good results are furnished, in particular, by a garnet $(Y, Tb)_3Al_5O_2$: (Ce, Pr).

The phosphor according to the invention can be excited in a wide range of the blue spectral region by radiation in the range from 420 to 490 nm, in particular 430 to 470 nm. A particularly good matching can be achieved to a light source, the peak wavelength of which is in the range 440 to 465 nm.

The phosphor has in particular a garnet structure

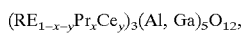

$(RE_{1-x-y}Pr_xCe_y)_3(Al, Ga)_5O_{12}$, where

RE=Y, Sc, Tb, Gd, La and/or Lu.

The concentration of the two activators should be selected in the following ranges:

$0.00005 \leq x \leq 0.05$;
$0.01 \leq y \leq 0.2$.

The second component B contains advantageously both Ga and Al and may additionally contain In.

It has become evident that the addition of Pr to the YAG:Ce host crystal must be accurately dimensioned, since, when the concentration is too high, the luminous efficacy deteriorates significantly, while, when the dimensioning is too low, a marked effect of the red improvement no longer occurs. A good indication for the calculation of the Pr are its lines which occur in the emission spectrum. In particular the amount of the praseodymium and the condition of the host lattice (selection of the components A and B) should be selected in such a way that, essentially, lines of the Pr below 650 nm appear in the emission spectrum, in particular the two lines of the Pr at 609 and 611 nm. The shorter-wave the red component can be selected, the higher the visual useful effect, since the sensitivity of the eyes decreases very strongly towards long wavelengths. A red component which is obtained by an emission at a wavelength above 650 nm, that is, in a range 650 to 700 nm, is therefore considerably less favorable.

In particular the amount of the praseodymium should be less than 0.3 mol % and should, in particular, be selected to be so small that the two lines of the Pr at 609 and 611 nm appear separated from one another in the emission spectrum. In addition, if the Pr amount is suitably dimensioned, the Pr line at 637 nm can also appear in the emission spectrum. Advantageously the amount of the praseodymium should be greater than 0.2 mol % and should be selected to be so high that the Pr line at 637 nm distinctly appears in the emission spectrum. For, as a result of this, an additional contribution in the red spectral region is obtained, in addition to the two other main lines of the Pr at 609 and 611 nm. It should, in particular, amount to at least 10% of the contribution of the other two lines.

The present invention also comprises a light source which primarily emits radiation in the short-wave blue range of the optical spectral region, this radiation being partially or completely converted into longer-wave radiation by means of a phosphor as specified above. In particular, the primary radiation emitted lies in the wavelength range from 420 to 490 nm, in particular 430 to 470 nm. The primary radiation source used is advantageously a blue-emitting light-emitting diode, in particular based on InGaN, in order to produce a white LED. A particularly good matching of phosphor to primary light source is obtained in the range of a peak emission of the LED in the range 440 to 465 nm. This is achieved by combining a blue LED (primary light source) with a phosphor as specified above, which is excited by the radiation from the LED and the emission (secondary radiation source) from which supplements the remaining blue primary LED radiation to form white light. In the case of using a single Pr-containing phosphor, this phosphor should emit mainly in a broad band in the yellow region of the spectrum and should emit additionally in a narrow band in the red region of the spectrum. In the case of using two Pr-containing phosphors, one of the phosphors should emit mainly in a broad band in the yellow region of the spectrum and should emit additionally in a narrow band in the red region of the spectrum (relatively low Pr content), while the second phosphor has an emission curve which is shifted, relatively to this, towards longer wavelength and has a relatively high Pr content (more than 50% higher than the first phosphor). In particular, the concentration of the Pr in the first phosphor should be selected in such a way that only the two Pr lines at 609 and 611 nm appear, while the concentration of the second phosphor may be selected in such a way that the additional line at 637 nm appears also and furnishes a contribution.

A process for producing the phosphor comprises the following process steps:

Comminution of the oxides and adding a flux;

First annealing in forming gas (mixture of $H_2$ and $N_2$);

Milling and screening;

Second annealing.

According to the invention, for light sources whose emission lies in the short-wave blue spectral region, the phosphor used has a garnet structure $A_3B_5O_{12}$ and is doped with Ce, the second component B representing at least one of the elements Al and Ga, the first component A containing praseodymium. Surprisingly, it has emerged that praseodymium (Pr) is eminently $0.00005 \leq x \leq 0.05$;

$0.01 \leq y \leq 0.2$.

The phosphor absorbs in the range from 400 to 500 nm, preferably between 430 and 470 nm, and can thus be excited by radiation from a blue light source which is in particular the radiation source for a lamp or LED. Good results were achieved with a blue LED with a maximum emission at 420 to 465 nm. When using pure YAG:Ce as base, in particular a range from 440 to 465 nm has proved useful; when using amounts of Lu and Ga, a peak wavelength between 420 and 450 nm is recommended.

This phosphor is particularly suitable for use in a white LED, based on the combination of a blue LED with the garnet phosphor which is excited by absorption of some of the radiation from the blue LED and the emission from which supplements the remaining radiation from the LED to form white light.

A particularly suitable blue LED is a Ga(In)N-LED, although any other way of generating a blue LED with emission in the range from 420 to 490 nm is also suitable. The principal emission range recommended is in particular 430 to 470 nm, since this is when efficiency is highest.

By selecting the type and quantity of rare earths RE, it is possible to finely adjust the position of the absorption bands and the emission bands.

In connection with light-emitting diodes, a range for X which is between 0.0005 and 0.01 is particularly suitable. The preferred range for y is 0.03 to 0.1.

The phosphor according to the invention is also suitable for combination with other phosphors, above suitable as an additional activator in the host lattice (first component A of the garnet), for example under blue excitation in the range from 420 to 490 nm. The standard emission range of the base phosphor of the type YAG:Ce material, the dopant of which is cerium, represents a broad band in the yellow spectral region. Due to the presence of the $Pr^{3+}$ in the material of the type YAG:$Ce^{3+}$, additional red light is emitted, with the result that the color locus can be controlled within a wider range and the color reproduction is improved compared to standard YAG:Ce materials. The red emission by $Pr^{3+}$ is possible because the Pr ion absorbs light which is emitted by the first activator, the Ce ion (above all at the wavelengths 480 to 500 nm), and emits light again. A second transfer mechanism which is surprisingly present is the direct transfer of energy from the Ce ion to the Pr ion. In this case, the Ce ion acts as a sensitizer for the second activator Pr.

The white light is generated, for example, by the combination of an Ga(In)N-LED with the phosphor YAG:Ce. In this case, apart from Pr, it is possible in particular for yttrium to be used as principal constituent of the first component A of the garnet on its own or together with at least one of the rare earths Tb, Gd, Sc, La and/or Lu.

The second component used is at least one of the elements Al or Ga. The second component B may additionally contain In.

In a particularly preferred embodiment, a garnet of the formula $A_3B_5O_{12}$: (Ce, Pr) having the stoichiometric structure $(RE_{1-x-y}Pr_xCe_y)_3(Al, Ga)_5O_{12}$ is used, where RE=Y, Gd, Sc, Tb, La and/or Lu;

all green-emitting phosphors, for example, with a green-emitting phosphor such as thiogallate, in which case above all gallium is under consideration as a constituent of the metallate, as well as, in particular, with other YAG:Ce phosphors, in particular a type which emits more (red) in the long-wave range. However, a particular advantage is that the addition of Pr often makes the use of a further phosphor which, in terms of its centroid, tends to emit more in the red spectral region superfluous.

BRIEF DESCRIPTION OF THE DRAWINGS

The invention is to be explained in more detail below with reference to a number of exemplary embodiments. In the drawing.

DESCRIPTION OF THE DRAWINGS

An exemplary embodiment of a phosphor according to the invention has the following composition $(RE_{1-x-y}Pr_xCe_y)_3(Al, Ga)_5O_{12}$, where
  RE=Y, Gd, Tb, Sc, La and/or Lu;
  $0.00005 \leq x \leq 0.05$;
  $0.01 \leq y \leq 0.2$.

The phosphor absorbs in the range from 400–500 nm and can be efficiently excited by the radiation from a blue LED (emission maximum between 430–470 nm). Its emission comprises a broad band in the yellow spectral region with a maximum at approximately 550–570 nm and additional sharp lines at 609 and 611 nm, which are attributable to the praseodymium. A further, weaker line of the Pr is found in the longer-wave red spectral region at 637 nm.

Figure 3:
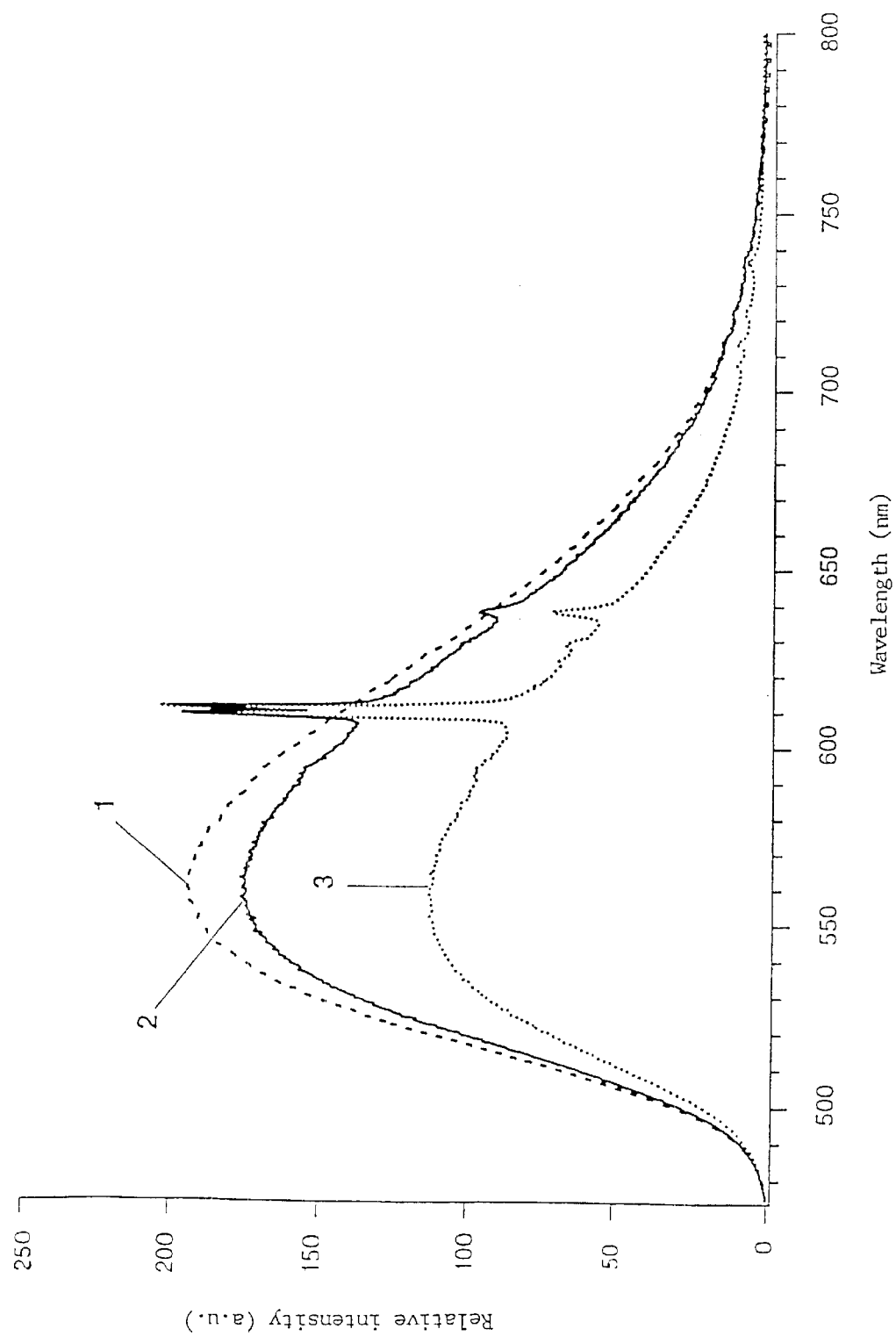
FIG. 3 shows emission spectrums of Ce-activated garnet phosphors having different Pr contents.

FIG. 3 shows the comparison between a pure YAG:Ce phosphor (1) and two Pr-containing phosphors (2, 3). The first phosphor represented by number (2) contains 0.1 mol % Pr, the second phosphor represented by number (3) contains 1 mol % Pr, the amount of the Ce being in each case 4 mol %. In the case of a high amount of Pr in the phosphor number (3), the concentration quenching is rendered clearly evident by reduced efficiency. On the other hand, the different share of the Pr lines in the overall spectrum can be clearly discerned. With about 0.5 mol % Pr, the line at 637 nm can only be discerned with difficulty. In contrast to pure YAG:Ce phosphor, a portion of the emitted radiation is put into the red lines of the Pr.

Figure 4:
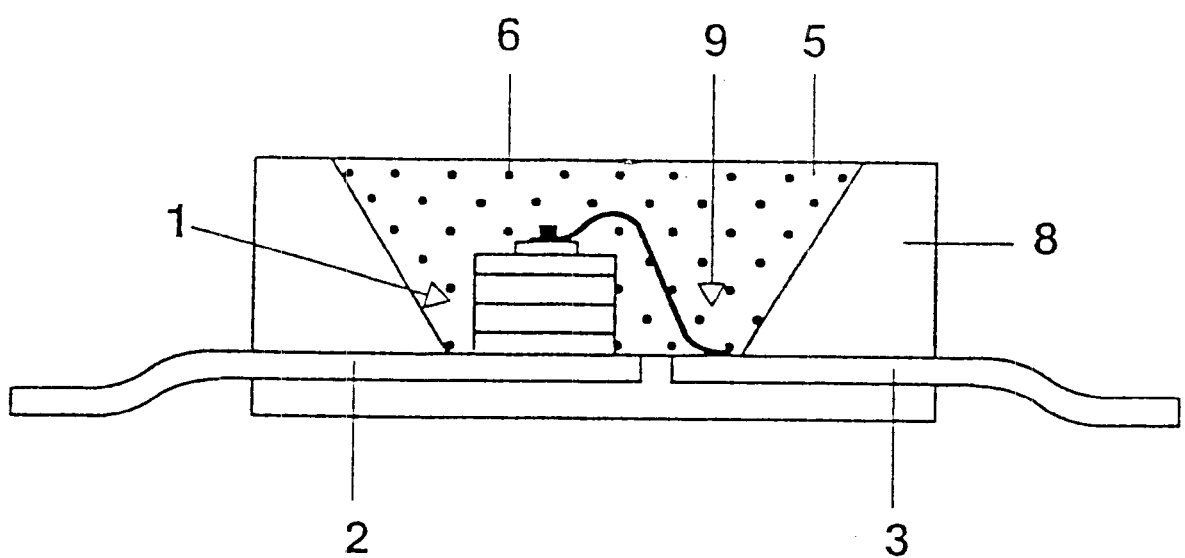
FIG. 4 shows a semiconductor element which serves as light source for white light.
Figure 5:
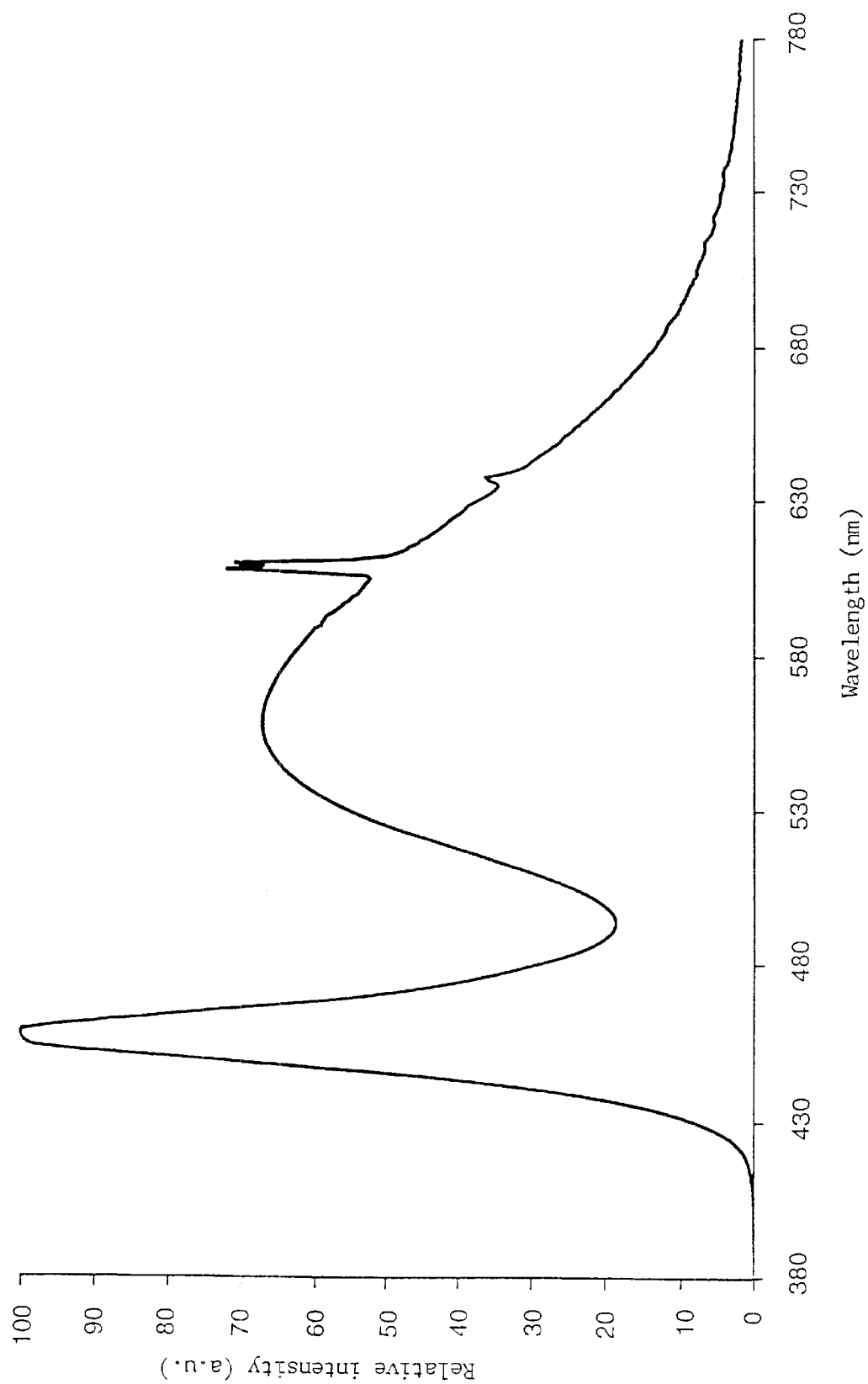
FIG. 5 shows an emission spectrum of a white LED which contains the phosphor of FIG. 1

The construction of a light source for white light is explicitly shown in FIG. 4. The light source is a semiconductor element (chip 1) of the type InGaN having a peak emission wavelength of 465 nm and a first and a second electrical terminal 2, 3, the semiconductor element being embedded in a basic housing 8, which is intransmissive for light, in the region of a recess 9. The recess 9 is filled with a potting mass 5 which comprises as main constituents an epoxy casting resin (80 to 90% by weight) and phosphor pigments 6 (less than 15% by weight) of the phosphor type (3). Further small amounts are provided, among others, by methyl ether and aerosil. The spectrum of this white LED is shown in FIG. 5.

While the InGaN LED (peak emission at 465 nm) having a color temperature of approximately 5500 K achieves, with the pure comparison phosphor, a color reproduction Ra=75 and R9=−+15, the LED having the phosphor (2) achieves a color reproduction of 80 and an R9 of +3. Although the phosphor (3) achieves still better values for Ra and R9, it is less well suited because of its considerably lower efficiency.

The intensity ratio between the yellow band and the red lines and therefore the color locus, can be varied by varying the $Pr^{3+}$ content (x content).

An improved color reproduction (compared to the same base phosphor without Pr) is achieved even if x is selected to be relatively small, in particular x<0.005. Selecting x up to at most 0.01, in pareticular in the range 0.0005<x<0.005, gives good results with regard to efficiency.

An exemplary embodiment for production is as follows:
The components

| | |
|---|---|
| 32.48 g | $Y_2O_3$ |
| 2.07 g | $CeO_2$ |
| 0.051 g | $Pr_6O_{11}$ |
| 26.41 g | $Al_2O_3$ |
| 0.149 g | $BaF_2$ |
| 0.077 g | $H_3BO_3$ | are mixed and are comminuted together with 150 g of aluminium oxide beads with a diameter of 10 mm in a 250 ml wide-necked PE flask. The mixture is annealed in a covered corundum crucible for 3 h at 1550° C. under forming gas (nitrogen containing 2.3% by volume hydrogen). The annealed material is milled in an automatic mortar mill and screened through a screen with a mesh width of 53 μm. This is followed by a second anneal for 3 h at 1500° C. under forming gas (nitrogen containing 0.5% by volume hydrogen). Then, milling and screening is carried out as after the first anneal.

Figure 1:
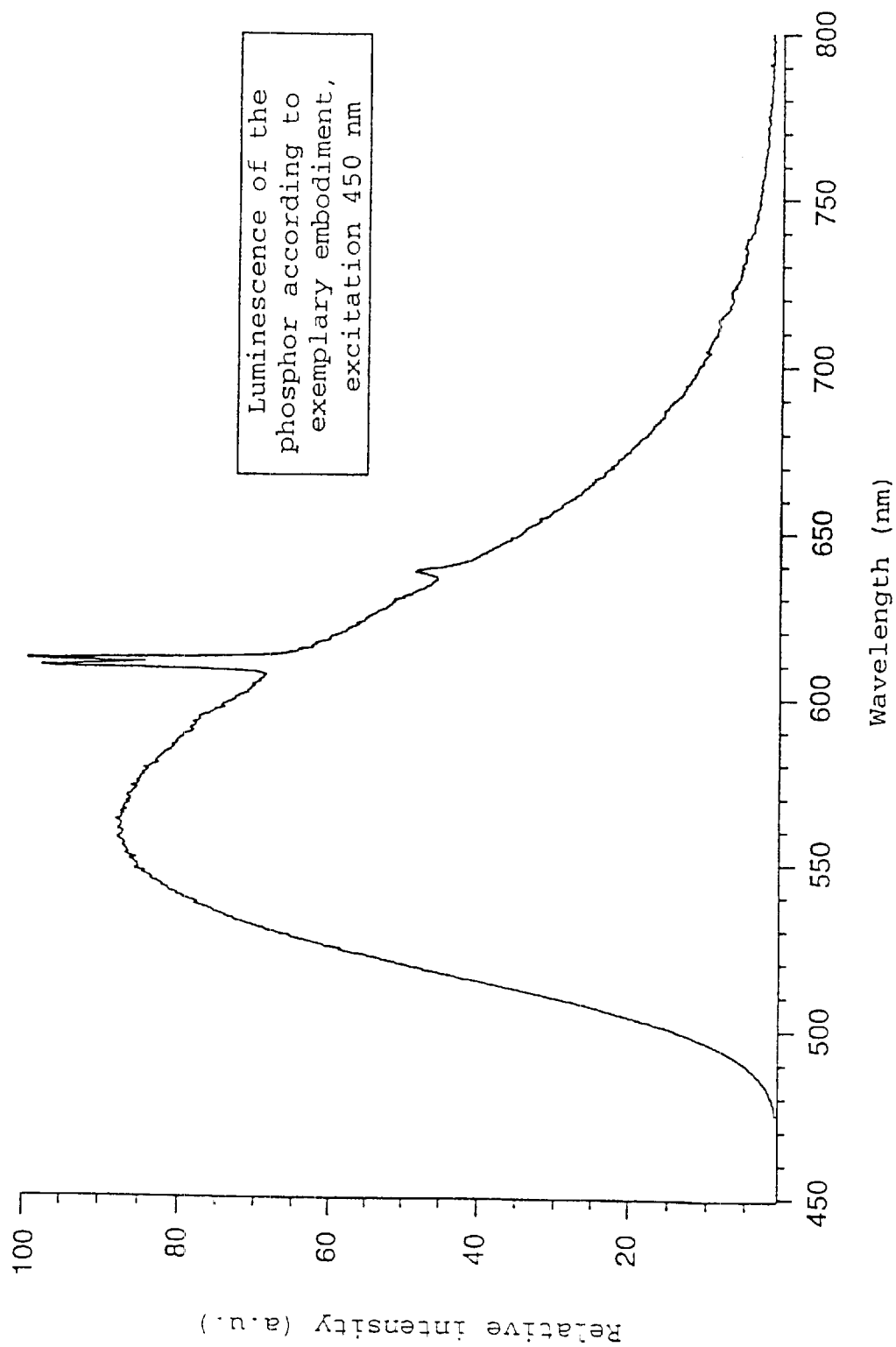
FIG. 1 shows an emission spectrum of a Pr-containing garnet phosphor.
Figure 2:
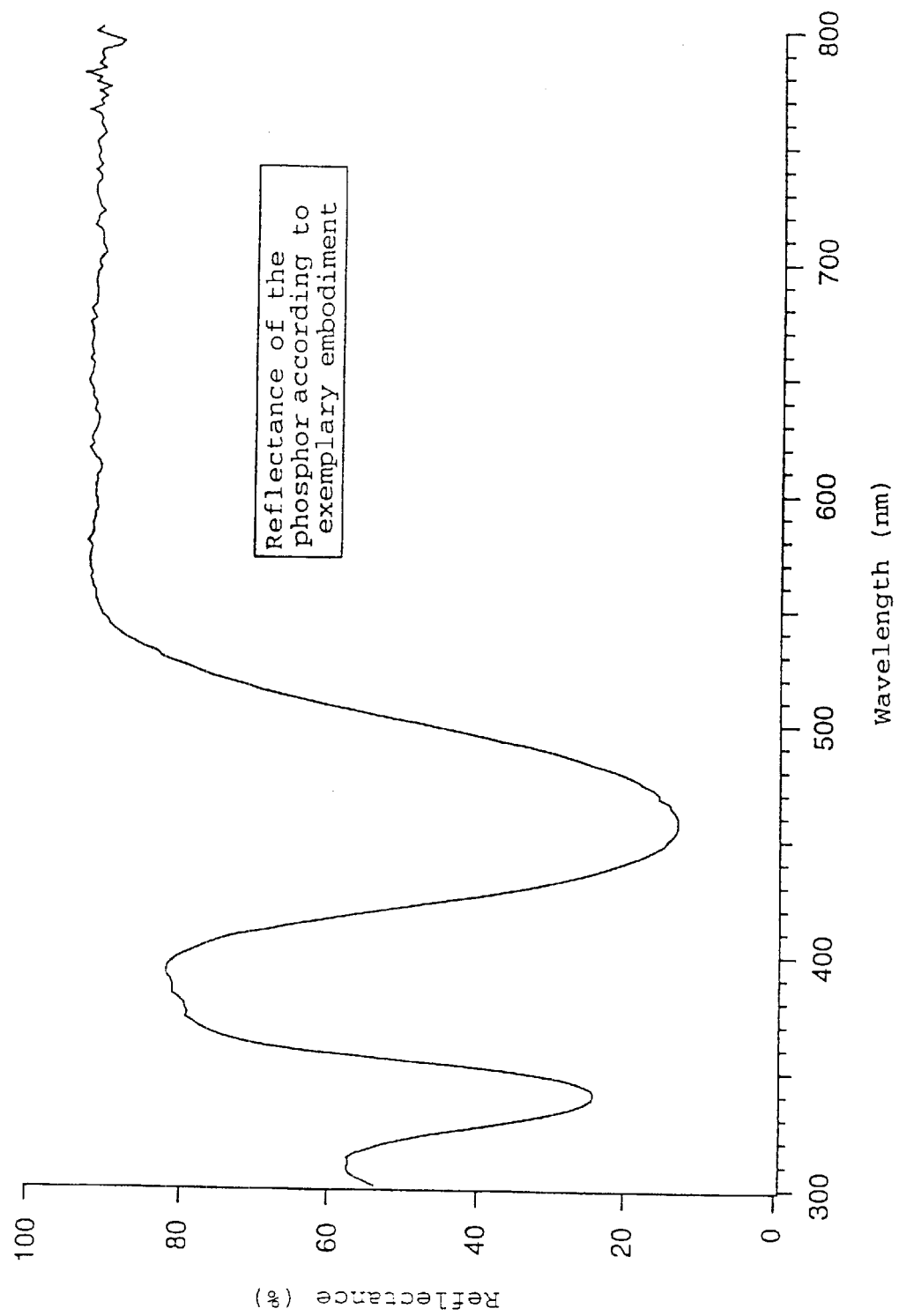
FIG. 2 shows a reflectance spectrum of a Pr-containing garnet phosphor.

The phosphor obtained corresponds to the composition $(Y_{0.959}Ce_{0.04}Pr_{0.001})_3Al_5O_{12}$. It has a strong yellow body color. A reflection and emission spectrum are shown as FIGS. 1 and 2.

What is claimed is:

1. Phosphor for excitation by a light-emitting radiation source, the emission from which lies in the short-wave optical spectral region between 420 and 490 nm, having a garnet structure $A_3B_5O_{12}$, which is activated with Ce, the second component B representing at least one of the elements Al and Ga, wherein the first component A contains a rare earth RE selected from the group consisting of Y, Tb, La and/or Lu, with a proportion of at most 5 mol %, of A being replaced by praseodymium, praseodymium acting as second activator in addition to Ce according to the formula $A_3B_5O_{12}$: (Ce,Pr).

2. The phosphor as claimed in claim 1, wherein the first component A contains in addition Gd and/or Sc as a non-luminous constituent of the host lattice.

3. The phosphor as claimed in claim 1, wherein the first component A is, more than 75 mol % yttrium.

4. The phosphor as claimed in claim 3, wherein the first component, in addition to Y and/or Lu, uses amounts of Tb, Sc, Gd and/or La.

5. The phosphor as claimed in claim 3 wherein the phosphor contains 0.1 to 20 mol % Tb.

6. The phosphor as claimed in claim 1, wherein the phosphor can be excited by radiation in the range from 430 to 470 nm.

7. The phosphor as claimed in claim 6 wherein the exciting radiation has a peak wavelength in the range from 440 to 465 nm.

8. The phosphor as claimed in claim 1, wherein a garnet of the overall structure $$(RE_{1-x-y}Pr_xCe_y)_3(Al,Ga)_5O_{12} \text{ is used,}$$

where
  RE=Y, Sc, Tb, Gd, La and/or Lu;
  having a concentration of the two activators Pr and Ce in the range:
  $0.00005 \leq x \leq 0.05$;
  $0.01 \leq y \leq 0.2$.

9. The phosphor as claimed in claim 1, wherein the second component B contains both Al and Ga.

10. The phosphor as claimed in claim 9 wherein the second component additionally contains In.

11. The phosphor as claimed in claim 1, wherein the amount of the Pr and the condition of the host lattice are so selected that the two lines of the Pr at 609 and 611 nm appear in the emission spectrum.

12. The phosphor as claimed in claim 11, wherein the amount of the Pr is selected to be so low as for the two lines of the Pr at 609 and 611 nm to appear separately in the emission spectrum.

13. The phosphor as claimed in claim 11, wherein the amount of the Pr is selected to be so high as for the Pr line at 637 nm to appear in the emission spectrum.

14. The phosphor of claim 11 wherein the amount of Pr is higher than 0.02 mol %.

15. The light source as claimed in claim 12, wherein the radiation is converted into longer-wave radiation by means of two phosphors as claimed in claim 1.

16. The light source as claimed in claim 12, characterized in that it has the following features for realizing a white-emitting LED:
- a light producing device, in particular a blue-emitting light-emitting diode which emits primary radiation;
- a wavelength conversion device which is connected to the light producing device, the primary radiation penetrating into the wavelength conversion device and there being partly converted into the secondary longer-wave radiation, the wavelength conversion device comprising at least one, of the phosphors as in claims 1 to 8, the wavelength conversion device further including a casting mass in which the phosphor(s) is (are) dispersed.

17. The light source as claimed in claim 12, wherein the primary radiation emitted is in the wavelength range from 430 to 470 nm.

18. The light source as claimed in claim 12, wherein the primary radiation source used is a blue-emitting light-emitting diode, based on InGaN, the peak emission of which is in the range from 440 to 465 nm.

19. A light source which primarily emits radiation in the short-wave range of the optical spectral region in the wavelength range from 420 to 490 nm, this radiation being partially or completely converted into secondary longer-wave radiation by means of a phosphor, as claimed in claim 1.

20. The light source as claimed in claim 19 wherein a single phosphor as claimed in claim 1 is used.

21. The phosphor as claimed in claim 1 wherein at most 1 mol % of A is replaced by praseodymium.

22. The phosphor as claimed in claim 1 wherein the amount Pr is lower than 0.3 mol %.

23. A phosphor having the general formula:

$$(RE_{1-x-y}Pr_xCe_y)_3(Al,Ga)_5O_{12}$$

where

RE=Y, Sc, Gd, Tb, La and/or Lu, $0.00005 \leq x \leq 0.05$, and $0.03 \leq y \leq 0.1$; and the phosphor having a broad band yellow emission and a narrow band red emission below 650 nm in response to excitation from a radiation source having an emission from 420 nm to 490 nm.

24. The phosphor of claim 23 wherein $0.0005 \leq x \leq 0.01$.

25. The phosphor of claim 23 wherein $0.0005 \leq x \leq 0.005$.

26. The phosphor of claim 23 wherein the phosphor has narrow band red emissions at 609 and 611 nm.

27. The phosphor of claim 26 wherein the phosphor has an additional narrow band red emission at 637 nm.

28. The phosphor of claim 27 wherein the 637 nm emission comprises at least 10% of the contribution of the 609 nm and 611 nm emissions.

29. A phosphor having the general formula $(Y_{0.959}Ce_{0.04}Pr_{0.001})_3Al_5O_{12}$.

* * * * *